United States Patent
Parris

(10) Patent No.: US 6,570,799 B1
(45) Date of Patent: May 27, 2003

(54) PRECHARGE AND REFERENCE VOLTAGE TECHNIQUE FOR DYNAMIC RANDOM ACCESS MEMORIES

(75) Inventor: Michael C. Parris, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/099,333

(22) Filed: Mar. 14, 2002

(51) Int. Cl.[7] ................................................. G11C 7/00
(52) U.S. Cl. ................... 365/203; 365/205; 365/189.05
(58) Field of Search ................................ 365/203, 210, 365/189.05, 202, 205, 207, 190

(56) References Cited

U.S. PATENT DOCUMENTS

| | | | |
|---|---|---|---|
| 4,669,065 A | 5/1987 | Ohsawa | 365/149 |
| 6,016,279 A * | 1/2000 | Chi | 366/149 |
| 6,111,803 A | 8/2000 | Derner et al. | 365/205 |
| 6,301,180 B1 * | 10/2001 | Sudo et al. | 365/191 |

OTHER PUBLICATIONS

Eto, Satoshi; Matsumiya, Masato; Takita, Masato; Ishii, Yuki; Nakamura, Toshikazu; Kawabata, Kuninori; Kano, Hideki; Kitamoto, Ayako; Ikeda, Toshimi; Koga, Toru; Higashiho, Mitsuhiro; Serizawa, Yuji; Itabashi, Kazuo; Tsuboi, Osamu; Yokoyama, Yuji; Taguchi, Masao, A 1–Gb SDRAM with Ground–Level Precharged Bit Line and Non-boosted 2.1–V Word Line, IEEE Journal of Solid–State Circuits, vol. 33, No. 11, Nov. 1998, pp. 1697–1701.

Eto, Satoshi; Matsumiya, Masato; Takita, Masato; Ishii, Yuki; Nakamura, Toshikazu; Kawabata, Kuninori; Kano, Hideki; Kitamoto, Ayako; Ikeda, Toshimi; Koga, Toru; Higashiho, Mitsuhiro; Serizawa, Yuji; Itabashi, Kazuo; Tsuboi, Osamu; Yokoyama, Yuji; Taguchi, Masao, A 1–Gb SDRAM with Ground–Level Precharged Bit Line and Non-boosted 2.1–V Word Line, 1998 IEEE International Solid-State Circuits Conference, ISSCC98/Session 5/DRAM/Paper TP 5.6, pp. 82–83, 419.

* cited by examiner

Primary Examiner—David Lam
(74) Attorney, Agent, or Firm—William J. Embida; Peter J. Meza; Hogan & Hartson LLP

(57) ABSTRACT

A pre-charge and reference voltage technique operates on a DRAM memory array in which two additional rows of reference cells are added to the array. When the array starts the pre-charge cycle, the regular word line and latch P-channel bar signals both turn off and the complementary bit line pair is shorted together. These two lines charge share to create a half way voltage level (VCC/2) that is restored into the reference cell. After this voltage is restored into the reference cell, the bit lines are fully pre-charged to ground.

30 Claims, 3 Drawing Sheets

PRECHARGE AND REFERENCE VOLTAGE TECHNIQUE FOR DYNAMIC RANDOM ACCESS MEMORIES

BACKGROUND OF THE INVENTION

The present invention, relates, to the field of dynamic random access memory ("DRAM") integrated circuit ("IC") memory devices and other ICs incorporating embedded DRAM arrays. More particularly, the present invention relates to a precharge and reference voltage technique for DRAM memory arrays which does not utilize a one half supply voltage level ("VCC/2") reference voltage bit line precharge level.

As supply voltages continue to decrease, and the voltage differential between a logic level "1" and a logic level "0" further diminishes, the motivation to implement bit line precharge techniques other than a conventional one half supply voltage level ("VCC/2") increases. In this regard, several VCC or VSS (circuit ground or reference voltage level) precharged bit line schemes have been designed into DRAMs over the years. In fact, some of the earliest DRAM designs utilized an analogous technique. The difficulty has, nevertheless remained in providing an acceptable and stable reference so that a logic level "0" with VSS precharged bit lines and a logic level "1" with VCC precharged bit lines can still be accurately sensed.

U.S. Pat. No. 6,111,803 issued Aug. 29, 2000 for: "Reduced Cell Voltage for Memory Device" to Derner et al. has proposed VCC precharged bit lines where charge bleeds off with the latch N-channel bar ("LNB") node to generate a reference voltage. U.S. Pat. No. 4,669,065 issued May 26, 1987 for: "Dynamic Memory Apparatus Having a Sense Amplifier and a Reference Voltage Connection Circuit Therefor" to Ohsawa describes a reference cell with an additional connection to the cell node to short two dummy cells together so that a VCC/2 reference voltage is generated and stored into each of the dummy cells.

Eto et al. "A 1-Gb SDRAM with Ground-Level Precharged Bi Line and Nonboosted 2.1-V Word Line"; IEEE Journal of Solid-State Circuits, Vol. 33, No. 11, November 1998 pp. 1697–1701 (See also: Eto et al. "A 1-Gb SDRAM with Ground-Level Precharged Bi Line and Nonboosted 2.1-V Word Line"; ISSCC98/Session 5/DRAM/Paper TP 5.6, pp 82–83, 419.) describes a grounded bit line precharge scheme wherein a reference level is generated by a metal oxide semiconductor ("MOS") capacitor coupled by a dummy word line.

All three of the aforementioned designs exhibit similar problems in that the reference generating techniques employed do not track with the actual memory cells. Therefore, because of manufacturing process variations, operating temperature changes and the like, acceptable operating margin will be taken away from both the logic "1" and "0" levels.

SUMMARY OF THE INVENTION

In accordance with the precharge and reference voltage technique for a DRAM memory array of the present invention, two additional rows of reference cells are added to the array. These identical cells can be used to generate a reference voltage for the reference bit line.

Since the reference cells are identical to the real memory cells, one half VCC needs to be stored (or half way between a logic level "0" and "1") into the reference cell. When the array starts the pre-charge cycle, the regular word line ("WL") and latch P-channel bar ("LPB") signals both turn "off". At this point, the SH1 signal goes "high" effectively shorting the complementary bit line pair ("BL" and "/BL") together. These two lines will charge share to create a half way level (VCC/2 if "1"=VCC and "0"=VSS) that will be restored into the reference cell since the reference cell word line ("XE" (Xeven) or "XO" (Xodd)) will still be "high". After this voltage is restored into the reference cell, the SH2 goes "high" and the bit lines are fully precharged to ground. During the start of the next active cycle, both the WL and the decoded XE or XO reference cell word lines will go "high" to generate the appropriate signal. XE and XO may be decoded with the least significant bit ("LSB") row address.

In an exemplary embodiment disclosed herein, a VSS, or logic level "0" bit line precharge sense amplifier is shown in which only the latch P-channel ("LP") and latch P-channel bar ("LPB") nodes are needed. The latch N-channel ("LN") node is shorted to ground. However, the technique of the present invention is likewise applicable to VCC precharged bit lines functioning in a similar fashion with the SH2 signal now operative to instead short the bit lines "high" (or to VCC) with the LP node coupled to VCC and latch N-channel bar ("LNB") node now being the active sense clock signal.

It should be noted that, due to the added capacitance of the reference cell being attached to one of the bit lines, the bit lines BL and /BL will not equilibrate to exactly VCC/2. In operation, they will instead equilibrate slightly higher or lower than this value depending on the data that was previously written to the reference cell during the conventional DRAM restore operation. Nevertheless, this effect is small if the bit lines are relatively long as is the case with large DRAM sub-arrays.

Particularly disclosed herein is an integrated circuit device incorporating a dynamic random access memory array. The device comprises at least one sense amplifier; a pair of complementary bit lines coupled to the sense amplifier; a plurality of memory cells coupled to each of the pair of complementary bit lines; at least one reference cell coupled to each of the pair of bit lines, and wherein the reference cell stores a reference voltage level substantially equal to an equilibrated voltage differential between each of the pair of bit lines. A word line is respectively coupled to each of the memory cells for selectively causing a read out of the contents of a corresponding one of the memory cells onto one of the pair of complementary bit lines and a reference cell word line is coupled to each of the reference cells, with the reference cell word line selectively causing the equilibrated voltage level to be stored in an associated one of the reference cells.

Also disclosed herein is a sense amplifier for a dynamic random access memory array including a plurality of memory cells associated with each of a pair of complementary bit lines. The sense amplifier comprises: a latch coupling the pair of complementary bit lines for latching a respective voltage level on each of the bit lines; a first switching device for selectively coupling the complementary bit lines together to establish an equilibrated voltage level; at least one reference cell coupled to each of the pair of complementary bit lines for storing the equilibrated voltage level; and second and third switching devices respectively coupled to one of the pair of said complementary bit lines for coupling the pair of bit lines to a common voltage source.

Still further disclosed herein is a bit line precharge technique for a dynamic random access memory array incorporating at least one sense amplifier coupled to a pair of complementary bit lines, with each of the complementary bit lines being coupled to a plurality of memory cells and at least one reference cell. The technique comprises the steps of: de-asserting a word line signal coupled to at least one of the memory cells; coupling the complementary bit lines together to provide an equilibrated voltage level; storing the equilibrated voltage level in the reference cell and coupling the complementary bit lines to a common voltage level.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
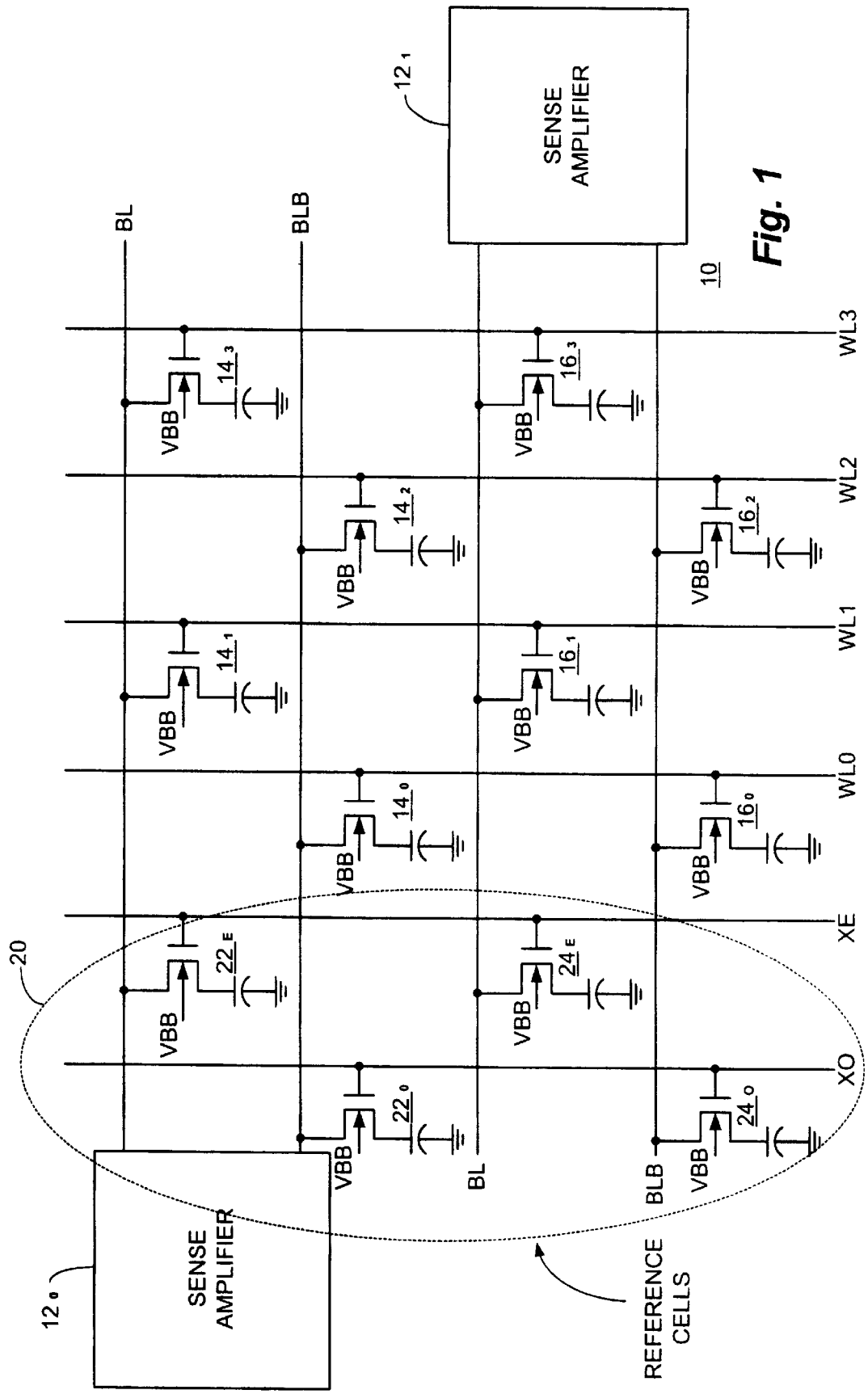
FIG. 1 illustrates a portion of a DRAM array which incorporates two additional rows of reference cells coupled between complementary bit line pairs BL and /BL and which are accessed by separate XO (Xodd) and XE (Xeven) word lines.

With reference now to FIG. 1, a portion of a DRAM array 10 is illustrated. The memory array 10 includes a pair of sense amplifiers $12_0$ and $12_1$ each coupled to a parallel pair of complementary bit lines BL and BLB to which a number of conventional one transistor/one capacitor ("1T/1C") memory cells are coupled. As illustrated, the memory cells $14_0$, $14_1$, $14_2$ and $14_3$ are coupled in an alternating fashion to the BLB and BL bit lines coupled to sense amplifier $12_0$ while the memory cells $16_0$, $16_1$, $16_2$ and $16_3$ are coupled to the bit lines coupled to sense amplifier $12_1$. The memory cells $14_0$ and $16_0$ are accessed by activation of word line "WL0"; the memory cells $14_1$ and $16_1$ are accessed by activation of word line "WL1"; the memory cells $14_2$ and $16_2$ are accessed by activation of word line "WL2"; and the memory cells $14_3$ and $16_3$ are accessed by activation of word line "WL3".

In accordance with the technique of the present invention disclosed herein, and additional two rows of reference cells 20 are included in the memory array 10 with reference cell $22_E$ coupled to bit line BL and reference cell $22_O$ coupled to bit line BLB of sense amplifier $12_0$ while reference cell $24_E$ is coupled to bit line BL and reference cell $24_O$ coupled to bit line BLB of sense amplifier $12_1$. The XO (Xodd) line accesses the reference cells $22_0$ and $24_0$ while the XE (Xeven) line accesses the reference cells $22_1$ and $24_1$.

Figure 2:
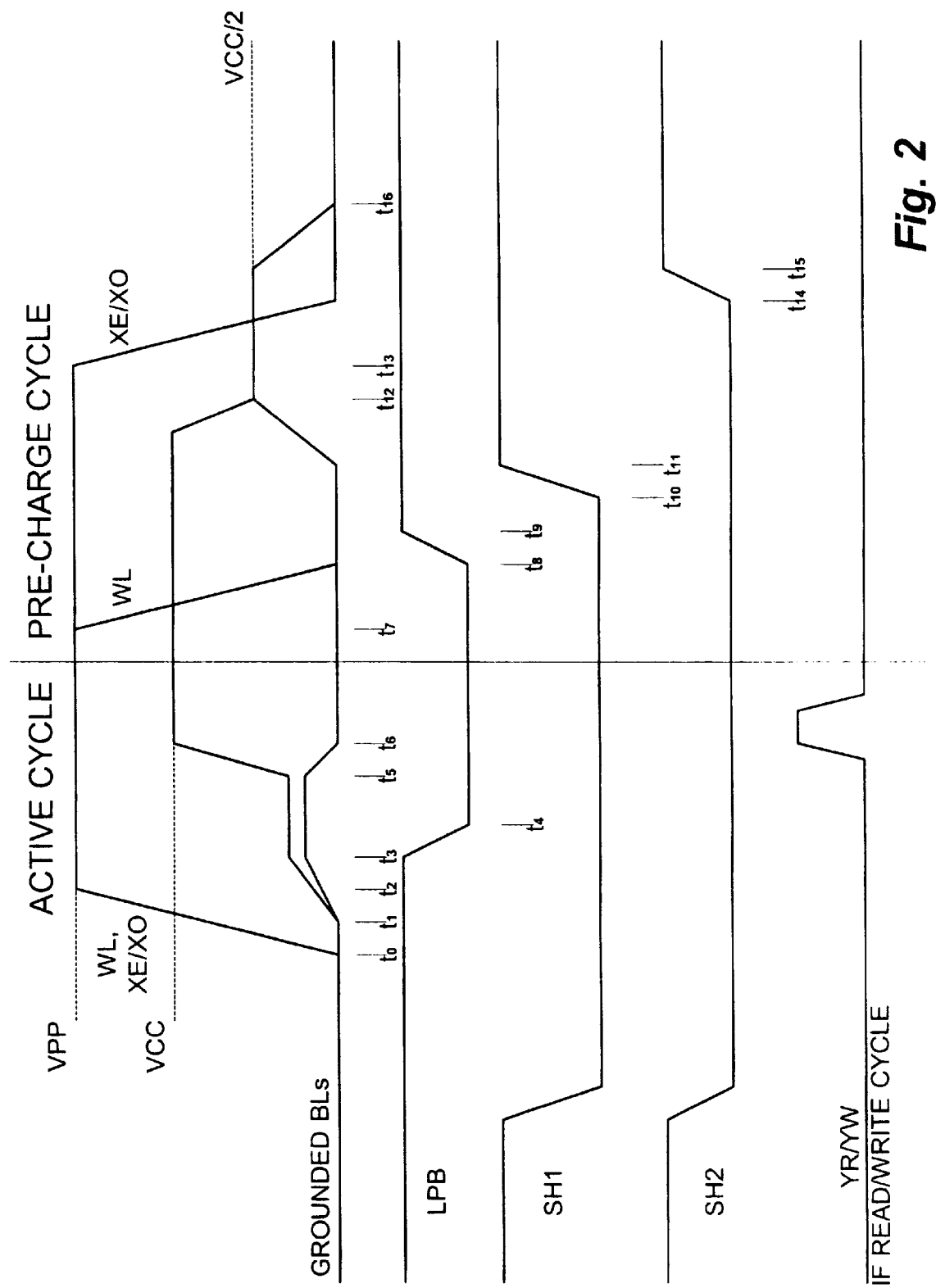
FIG. 2 is a simplified signal timing diagram that illustrates the storing of a value equal to half way between that of a logic level "0" and logic level "1" into the reference cells of the preceding figure in a representative a VSS level bit line precharge implementation.

With reference additionally now to FIG. 2, a simplified signal timing diagram is shown that illustrates the storing of a value equal to half way between that of a logic level "0" and logic level "1" into the reference cells 22, 24 of the preceding figure in a representative a VSS level bit line precharge implementation.

As illustrated, during the memory array 10 "active" cycle (time $t_0$) the word lines ("WL") and reference cell word lines ("XO" and "XE") are asserted. Thereafter, (time $t_1$) the complementary bit lines BL and BLB begin to rise from a grounded ("VSS") level. The WL and XO/XE word lines then achieve a pumped voltage level of VPP (time $t_2$) which is substantially VCC*2. The LPB signal is then de-asserted (time $t_3$) and the BL and BLB bit lines achieve a steady differential voltage level. LPB is next at a logic level "0" (time $t_4$) and the BL and BLB lines begin (time $t_5$) to further separate to a level of VCC and VSS (time $t_6$).

During the "pre-charge" cycle, the WL is begun to be brought from a level of VPP (time $t_7$) to a level of VSS (time $t_8$) substantially the same time that LPB is being brought from a logic level "0" state toward VCC (time $t_9$). SH1 is asserted (time $t_{10}$) and rises to VCC (time $t_{11}$) equilibrating the bit lines BL and BLB which then both reach a VCC/2 level (time $t_{12}$). The XO and XE word lines are de-asserted (time $t_{13}$) and SH2 is the asserted (time $t_{14}$) and reaches a level of VCC (time $t_{15}$). Meanwhile, the XO and XE word lines are once again at a level of VSS. The BL and BLB bit lines are both brought to a level of VSS (time $t_{16}$) due to the assertion of the SH2 signal. As also indicated, the column "read" ("YR") and/or column "write" ("YW") signals are also indicated if a read/write cycle occurs during the "active" cycle.

Figure 3:
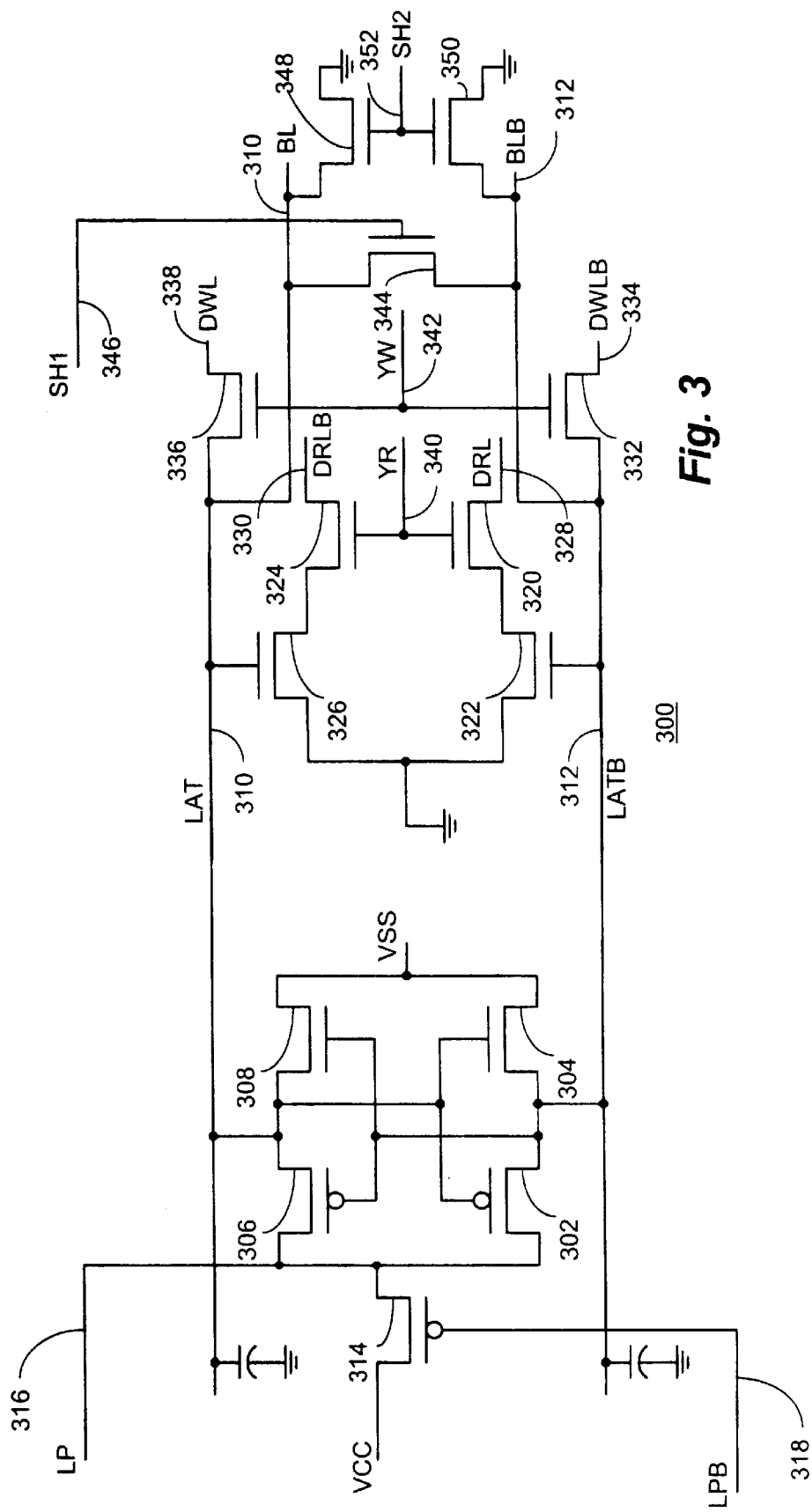
FIG. 3 is a detailed schematic illustration of a possible sense amplifier design for implementing the technique of the present invention in accordance with the timing diagram of the preceding figure.

With reference additionally now to FIG. 3, a detailed schematic illustration of a possible sense amplifier 300 design for implementing the technique of the present invention in accordance with the timing diagram of the preceding figure is shown. The sense amplifier 300 illustrated is a particular, representative implementation for a VSS level bit line precharge implementation and it should be noted that, in accordance with the disclosure of the present invention, a VCC level bit line precharge implementation may be employed instead.

The sense amplifier 300 comprises a latch made up of cross-coupled inverters comprising series connected P-channel transistor 302 and N-channel transistor 304 together with P-channel transistor 306 and N-channel transistor 308 connected between VSS and a "latch P-channel" ("LP") node 316. The output of the inverter comprising series connected transistors 306 and 308 is coupled to latch node ("LAT") 310 while the output of the inverter comprising series connected transistors 302 and 304 is coupled to a complementary latch node ("LATB") 312. A P-channel transistor 314 couples the supply voltage VCC to the LP node 316 in response to a "latch P-channel bar" ("LPB") signal on line 318.

A pair of series connected N-channel transistors 320 and 322 are coupled between a data "read" latch ("DRL") node 328 and circuit ground (VSS) while another series connected pair of N-channel transistors 324 and 326 are coupled between a complementary data "read" latch bar ("DRLB") node 330 and circuit ground. The gates of transistors 322 and 326 are coupled to the LATB node 312 and LAT node 310 respectively while the gates of transistors 320 and 324 are coupled together to receive a column "read" ("YR") signal on line 340.

An N-channel transistor 332 couples a data "write" latch bar ("DWLB") signal on line 334 to the LATB node 312 while a corresponding N-channel transistor 336 couples a data "write" latch ("DWL") signal on line 338 to LAT node 310 in response to a column "write" signal ("YW") on line 342 applied to the gates of transistors 332 and 336. An N-channel transistor 344 is connected across the LAT and LATB nodes 310 and 312 which are connected directly to the bit lines BL and BLB respectively. The bit lines BL and BLB are, therefore, coupled together upon the assertion of the SH1 signal applied to the gate of transistor 344 on line 346. An additional N-channel transistor 348 couples the BL line 310 to circuit ground while a corresponding N-channel transistor 350 couples the BLB line 312 to circuit ground in response to the assertion of an SH2 signal applied to the gate terminal of both devices on line 352.

In accordance with the technique of the present invention, two additional rows of reference cells 22 and 24 (FIG. 1) are added to the memory array 10 and used to generate a reference voltage for the reference bit line. Since the reference cells 22, 24 are identical to the real memory cells 14, 16, a VCC/2 level is stored (or half way between a logic level "0" and "1") into the reference cells 22, 24. When the array 10 starts the pre-charge cycle, the regular word line ("WL") and latch P-channel bar ("LPB") signal on line 318 both turn "off". At this point, the SH1 signal on line 346 goes "high" effectively shorting the complementary bit line pair ("BL" and "/BL") 310, 312 together. These two lines will charge share to create a half way level (VCC/2 if "1"=VCC and "0"=VSS) that will be restored into the reference cell 22, 24 (FIG. 1) since the reference cell word line ("XE" or "XO") will still be "high". After this voltage is restored into the reference cell, the SH2 signal on line 352 goes "high" and the bit lines 310, 312 are fully precharged to ground. During the start of the next active cycle, both the WL and the decoded XE or XO reference cell word lines will go "high" to generate the appropriate signal. (XE or XO is Xeven or Xodd, decoded with the least significant bit ("LSB") row address.)

Since, in the particular embodiment of the present invention shown, a VSS, or logic level "0" bit line precharge sense amplifier 300 is illustrated, only the latch P-channel ("LP") 316 and latch P-channel bar ("LPB") 318 nodes are needed and the latch N-channel ("LN") node between transistors 304 and 308 is shorted to ground. However, the technique of the present invention is likewise applicable to VCC pre-charged bit lines functioning in a similar fashion with the SH2 signal on line 352 now operative to instead short the bit lines "high" with the LP node 316 coupled to VCC and a latch N-channel bar ("LNB") node (comprising the gate terminal of an additional N-channel transistor, not shown, selectively coupling the common connected terminals of transistors 304 and 308 to circuit ground) now being the active sense clock signal.

It should be noted that, due to the added capacitance of the reference cell 22, 24 being attached to one of the bit lines, the bit lines BL and /BL will not equilibrate to exactly VCC/2. In operation, they will instead equilibrate slightly higher or lower than this value depending on the data that was previously written to the reference cell during the conventional DRAM restore operation. Nevertheless, this effect is small if the bit lines are relatively long as is the case with large DRAM sub-arrays.

While there have been described above the principles of the present invention in conjunction with a specific layout and CMOS implementation, it is to be clearly understood that the foregoing description is made only by way of example and not as a limitation to the scope of the invention. Particularly, it is recognized that the teachings of AUM the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A bit line precharge technique for a dynamic random access memory array incorporating at least one sense amplifier coupled to a pair of complementary bit lines, each of said pair of complementary bit lines coupled to a plurality of memory cells and at least one reference cell, the technique comprising:

de-asserting a word line signal coupled to at least one of said memory cells;

coupling said pair of complementary bit lines together to provide an equilibrated voltage level;

storing said equilibrated voltage level in said at least one reference cell;

coupling said pair of complementary bit lines to a common voltage level;

asserting said word line signal; and further asserting first and second reference cell word line signals respectively coupled to said at least one reference cell coupled to said pair of complementary bit lines.

2. The technique of claim 1 further comprising:

latching said sense amplifier prior to said step of coupling said complementary bit lines together.

3. The technique of claim 1 wherein said equilibrated voltage level is substantially one half a supply voltage level for said memory array.

4. The technique of claim 1 wherein said common voltage level is substantially zero volts.

5. The technique of claim 1 wherein said common voltage level is substantially a supply voltage level for said memory array.

6. The technique of claim 1 further comprising:

de-asserting said first and second reference cell word line signals prior to said step of coupling said complementary bit lines to a common voltage level.

7. The technique of claim 1 wherein said reference cell is substantially identical to each of said plurality of memory cells.

8. The technique of claim 1 wherein a first of said complementary bit lines is initially at substantially a supply voltage level for said memory array and a second of said complementary bit lines is initially at substantially zero volts.

9. A bit line precharge technique for a dynamic random access memory array incorporating at least one sense amplifier coupled to a pair of complementary bit lines, each of said pair of complementary bit lines coupled to a plurality of memory cells and at least one reference cell, the technique comprising:

de-asserting a word line signal coupled to at least one of said memory cells;

coupling said pair of complementary bit lines together to provide an equilibrated voltage level;

storing said equilibrated voltage level in said at least one reference cell;

and coupling said pair of complementary bit lines to a common voltage level, wherein said reference cell is substantially identical to each of said plurality of memory cells.

10. The technique of claim 9 further comprising:

latching said sense amplifier prior to said step of coupling said complementary bit lines together.

11. The technique of claim 9 wherein said equilibrated voltage level is substantially one half a supply voltage level for said memory array.

12. The technique of claim 9 wherein said common voltage level is substantially zero volts.

13. The technique of claim 9 wherein said common voltage level is substantially a supply voltage level for said memory array.

14. The technique of claim 9 further comprising:

asserting said word line signal;

further asserting first and second reference cell word line signals respectively coupled to said at least one reference cell coupled to said complementary bit lines.

15. The technique of claim 14 further comprising:

de-asserting said first and second reference cell word line signals prior to said step of coupling said complementary bit lines to a common voltage level.

16. The technique of claim 9 wherein a first of said complementary bit lines is initially at substantially a supply voltage level for said memory array and a second of said complementary bit lines is initially at substantially zero volts.

17. A bit line precharge technique for a dynamic random access memory array incorporating at least one sense amplifier coupled to a pair of complementary bit lines, each of said pair of complementary bit lines coupled to a plurality of memory cells and at least one reference cell, the technique comprising:

de-asserting a word line signal coupled to at least one of said memory cells;

coupling said pair of complementary bit lines together to provide an equilibrated voltage level;

storing said equilibrated voltage level in said at least one reference cell;

and coupling said pair of complementary bit lines to a common voltage level, wherein a first of said pair of complementary bit lines is initially at substantially a supply voltage level for said memory array and a second of said pair of complementary bit lines is initially at substantially zero volts.

18. The technique of claim 17 further comprising:

latching said sense amplifier prior to said step of coupling said complementary bit lines together.

19. The technique of claim 17 wherein said equilibrated voltage level is substantially one half a supply voltage level for said memory array.

20. The technique of claim 17 wherein said common voltage level is substantially zero volts.

21. The technique of claim 17 wherein said common voltage level is substantially a supply voltage level for said memory array.

22. The technique of claim 17 further comprising:

asserting said word line signal;

further asserting first and second reference cell word line signals respectively coupled to said at least one reference cell coupled to said complementary bit lines.

23. The technique of claim 22 further comprising:

de-asserting said first and second reference cell word line signals prior to said step of coupling said complementary bit lines to a common voltage level.

24. The technique of claim 17 wherein said reference cell is substantially identical to each of said plurality of memory cells.

25. A sense amplifier for a dynamic random access memory array including a plurality of memory cells associated with each of a pair of complementary bit lines, said sense amplifier comprising:

a CMOS latch having a latch P-channel node coupled to a source of supply voltage through a fourth switching device and an opposite N-channel node coupled to a circuit ground, said CMOS latch coupling said pair of complementary bit lines for latching a respective voltage level on each of said complementary bit lines;

a first switching device for selectively coupling said complementary bit lines together to establish an equilibrated voltage level;

at least one reference cell coupled to each of said pair of complementary bit lines for storing said equilibrated voltage level; and second and third switching devices respectively coupled to one of said pair of said complementary bit lines for coupling said pair of bit lines to a common voltage source at a potential of substantially zero volts.

26. The sense amplifier of claim 25 wherein said fourth switching device is a P-channel transistor.

27. The sense amplifier of claim 25 wherein said equilibrated voltage level is substantially one half of a supply voltage level furnished to said memory array.

28. A sense amplifier for a dynamic random access memory array including a plurality of memory cells associated with each of a pair of complementary bit lines, said sense amplifier comprising:

a latch having a latch N-channel node coupled to a circuit ground through a fourth switching device and an opposite P-channel node thereof coupled to a supply voltage line, said latch coupling said pair of complementary bit lines for latching a respective voltage level on each of said complementary bit lines;

a first switching device for selectively coupling said complementary bit lines together to establish an equilibrated voltage level;

at least one reference cell coupled to each of said pair of complementary bit lines for storing said equilibrated voltage level; and second and third switching devices respectively coupled to one of said pair of said complementary bit lines for coupling said pair of bit lines to a common voltage source at a potential of substantially said supply voltage line.

29. The sense amplifier of claim 28 wherein said fourth switching device is an N-channel transistor.

30. The sense amplifier of claim 28 wherein said equilibrated voltage level is substantially one half of a supply voltage level furnished to said memory array.

* * * * *